United States Patent
Beak et al.

(10) Patent No.: US 9,842,915 B2
(45) Date of Patent: Dec. 12, 2017

(54) ARRAY SUBSTRATE FOR LIQUID CRYSTAL DISPLAY DEVICE AND METHOD OF MANUFACTURING THE SAME

(71) Applicant: LG DISPLAY CO., LTD., Seoul (KR)

(72) Inventors: Jung-Sun Beak, Paju-si (KR); Jung-Ho Bang, Panju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/360,468

(22) Filed: Nov. 23, 2016

(65) Prior Publication Data

US 2017/0077271 A1 Mar. 16, 2017

Related U.S. Application Data

(62) Division of application No. 14/499,366, filed on Sep. 29, 2014, now abandoned.

(30) Foreign Application Priority Data

Oct. 31, 2013 (KR) .................. 10-2013-0131396

(51) Int. Cl.
| | |
|---|---|
| *H01L 21/00* | (2006.01) |
| *H01L 21/84* | (2006.01) |
| *H01L 29/66* | (2006.01) |
| *H01L 27/12* | (2006.01) |
| *H01L 29/45* | (2006.01) |

(Continued)

(52) U.S. Cl.
CPC .. *H01L 29/66969* (2013.01); *H01L 21/02244* (2013.01); *H01L 21/02252* (2013.01); *H01L 21/02255* (2013.01); *H01L 21/32139* (2013.01); *H01L 21/44* (2013.01); *H01L 27/1225* (2013.01); *H01L 27/1259* (2013.01); *H01L 27/1288* (2013.01); *H01L 29/41733* (2013.01); *H01L 29/45* (2013.01); *H01L 29/7869* (2013.01); *H01L 29/78618* (2013.01); *H01L 21/0273* (2013.01)

(58) Field of Classification Search
CPC ............. H01L 29/7869; H01L 27/1225; H01L 27/124; H01L 29/66757; H01L 27/12; H01L 27/1214; H01L 27/1248; H01L 2924/0002; H01L 29/41733; H01L 29/458; H01L 29/66765; H01L 29/66969; H01L 21/16; H01L 21/00; H01L 21/02554; H01L 21/02565
USPC .......... 257/E27.111, 72, 43, 59, 347, 57, 66; 438/34, 104, 149, 151, 158, 478
See application file for complete search history.

(56) References Cited

U.S. PATENT DOCUMENTS

| | | | |
|---|---|---|---|
| 6,294,799 B1 | 9/2001 | Yamazaki et al. | |
| 2002/0016026 A1* | 2/2002 | Tsujimura | C23C 16/4404 438/149 |

(Continued)

FOREIGN PATENT DOCUMENTS

| | | |
|---|---|---|
| CN | 101388343 A | 3/2009 |
| CN | 101908537 A | 12/2010 |

*Primary Examiner* — Lex Malsawma
*Assistant Examiner* — Nduka Ojeh
(74) *Attorney, Agent, or Firm* — Dentons US LLP

(57) ABSTRACT

An array substrate for a liquid crystal display device includes a substrate; a semiconductor layer on the substrate; a gate electrode on the semiconductor layer; source and drain electrodes that are on and contact the semiconductor layer; and an oxide layer that corresponds to the semiconductor layer and is on the gate electrode.

8 Claims, 5 Drawing Sheets

(51) Int. Cl.
H01L 29/417 (2006.01)
H01L 21/02 (2006.01)
H01L 21/3213 (2006.01)
H01L 29/786 (2006.01)
H01L 21/44 (2006.01)
H01L 21/027 (2006.01)

(56) References Cited

U.S. PATENT DOCUMENTS

| | | | |
|---|---|---|---|
| 2006/0226425 A1* | 10/2006 | Chae | B82Y 10/00 257/59 |
| 2009/0244424 A1 | 10/2009 | Kim et al. | |
| 2010/0276688 A1 | 11/2010 | Yano et al. | |
| 2011/0240998 A1* | 10/2011 | Morosawa | H01L 29/41733 257/57 |
| 2012/0008072 A1* | 1/2012 | Lee | G02F 1/134363 349/106 |
| 2013/0037807 A1* | 2/2013 | Fukaya | H01L 27/1225 257/57 |
| 2013/0207103 A1* | 8/2013 | Lee | H01L 29/66742 257/43 |
| 2013/0207104 A1 | 8/2013 | Lee | |

* cited by examiner

ARRAY SUBSTRATE FOR LIQUID CRYSTAL DISPLAY DEVICE AND METHOD OF MANUFACTURING THE SAME

This application is a Divisional of U.S. patent application Ser. No. 14/499,366 filed Sep. 29, 2014, and claims the benefit of Korean Patent Application No. 10-2013-0131396, filed on Oct. 31, 2013, which is hereby incorporated by reference for all purposes as if fully set forth herein.

BACKGROUND

Field of the Disclosure

The present disclosure relates to an array substrate for a liquid crystal display device (LCD), and more particularly, to an array substrate for an LCD including a coplanar type thin film transistor (TFT) and a method of manufacturing the same.

Discussion of the Prior Art

With the advancement of information society, demand for a display device capable of displaying an image has increased in various forms. Recently, various flat panel display devices, such as a liquid crystal display device (LCD), a plasma display panel (PDP), and an organic light emitting diode display (OLED), have been used.

Among these flat panel display devices, the LCD has advantages of low power consumption due to low driving voltage and portability, and thus is widely used in various fields, such as laptop computer, monitor, spacecraft, and airplane.

Particularly, an active matrix LCD device in which a thin film transistor (TFT) as a switching element is formed in each of pixels arranged in a matrix has been commonly used.

The TFT are categorized into various types according to positions of a gate electrode, for example, a staggered type, an inverted staggered type, and a coplanar type.

The coplanar type TFT has excellent element property because an active layer thereof is not damaged when etching source and drain electrodes.

The coplanar type TFT has a structure that a gate electrode, and the source and drain electrodes are located over the active layer.

FIG. 1 is a cross-sectional view illustrating the coplanar type TFT according to the prior art.

Referring to FIG. 1, a buffer layer 11 is formed on a substrate 10. An active layer 24 is formed on the buffer layer 11 and includes a channel region 24a and source and drain regions 24b and 24c at both sides, and a first insulating layer 15a is formed on the active layer 24.

A gate electrode 21 is formed on the first insulating layer 15a, and a second insulating layer 15b is formed on the gate electrode 21 and includes contact holes exposing the source and drain regions 24b and 24c. Source and drain electrodes 22 and 23 are formed on the second insulating layer 15b and contact the source and drain regions 24b and 24c, respectively.

The active layer 24, the gate electrode 21, and the source and drain electrodes 22 and 23 as above form a coplanar type TFT.

A third insulating layer 15c is formed on the source and drain electrodes 22 and 23 and includes a contact hole exposing the drain electrode 23. A pixel electrode 18 is formed on the third insulating layer 15c and contacts the drain electrode 23.

The active layer 24 is made of a ZnO based semiconductor material, thus has a high mobility and meets a constant current test condition, and thus is applicable to a large-sized display.

The ZnO is a material that can have a conductor property, a semiconductor property, or a nonconductor property according to a content of oxygen. Accordingly, the active layer using the ZnO is applicable to a large-sized display, for example, LCD or OLED.

However, the second insulating layer 15b is formed to prevent the active layer 24 of the ZnO based material from being exposed, and thus a number of mask processes increases.

Thus, steps of production processes increase, thus production cost increases, and productivity decreases.

SUMMARY OF THE INVENTION

Accordingly, the present invention is directed to an array substrate for an LCD and a method of manufacturing the same that can decrease steps of production processes and improve productivity.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described herein, an array substrate for a liquid crystal display device includes a substrate; a semiconductor layer on the substrate; a gate electrode on the semiconductor layer; source and drain electrodes that are on and contact the semiconductor layer; and an oxide layer that corresponds to the semiconductor layer and is on the gate electrode.

In another aspect, a method of an array substrate for a liquid crystal display device includes forming semiconductor layer on a substrate; forming a gate electrode on the semiconductor layer; forming a first metal layer and a second metal layer sequentially on the gate electrode; patterning the first metal layer and the second metal layer to form a first metal pattern and a second metal pattern, respectively; etching the second metal pattern to expose a portion of the first metal pattern and form a first source pattern and a first drain pattern; and oxidizing the exposed portion of the first metal pattern to form an oxide layer, a second source pattern and a second drain pattern, wherein the first and second source patterns form a source electrode, and the first and second drain patterns form a drain electrode.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to exemplary embodiments, examples of which are illustrated in the accompanying drawings.

A TFT of the present invention may be a polycrystalline type TFT, an amorphous type TFT, or oxide type TFT. For the purpose of explanations, the oxide TFT is explained in the below embodiment.

Figure 2:
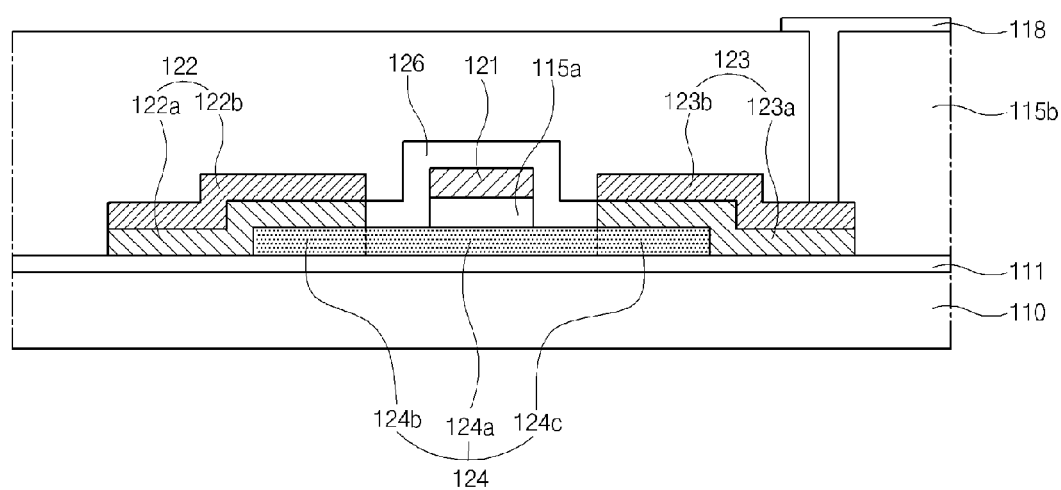
FIG. 2 is a cross-sectional view illustrating an array substrate for an LCD according to an embodiment of the present invention.

FIG. 2 is a cross-sectional view illustrating an array substrate for an LCD according to an embodiment of the present invention.

Referring to FIG. 2, in the array substrate for the LCD, a buffer layer 111 is formed on a substrate 110. Alternatively, the buffer layer 111 may be eliminated.

An active layer 124 as a semiconductor layer is formed on the buffer layer 111 and includes a channel region 124a and source and drain regions 124b and 124c at both sides, and a first insulating layer 115a is formed on the channel region 124a and covers a part of the channel region 124a.

A gate electrode 121 is formed on the first insulating layer 115a. An oxide layer 126 covers the gate electrode 121 and corresponds to the channel region 124a.

Second source and drain patterns 122b and 123b cover and contact the source and drain regions 124b and 124c, respectively. First source and drain patterns 122a and 123a are formed on and substantially have the same pattern as the second source and drain patterns 122b and 123b, respectively. The first and second source patterns 122a and 122b form a source electrode 122, and the first and second drain patterns 123a and 123b form a drain electrode 123.

The active layer 124, the gate electrode 121, and the source and drain electrodes 122 and 123 as above form a coplanar type TFT.

A second insulating layer 115b is formed entirely on the second substrate 110 having the source and drain electrodes 122 and 123, and includes a contact hole exposing the drain electrode 123. A pixel electrode 118 is formed on the second insulating layer 115b and contacts the drain electrode 123 via the contact hole of the second insulating layer 115b.

The active layer 124 is formed of a ZnO based semiconductor material, for example, IGZO. The ZnO is a material that can have a conductor property, a semiconductor property, or a nonconductor property according to a content of oxygen. Accordingly, the active layer 124 using the ZnO is applicable to a large-sized display, for example, LCD or OLED.

In the embodiment, by adjusting a concentration of oxygen in a reaction gas in a sputtering process, a concentration of carrier of the active layer 124 can be adjusted, and thus property of the TFT can be adjusted.

Since the active layer 124 is made of the ZnO based semiconductor material, it has a high mobility and meets a constant current test condition, and thus is applicable to a large-sized display.

The active layer 124 is not exposed by using the source and drain electrodes 122 and 123 and the oxide layer 126.

Figure 1:
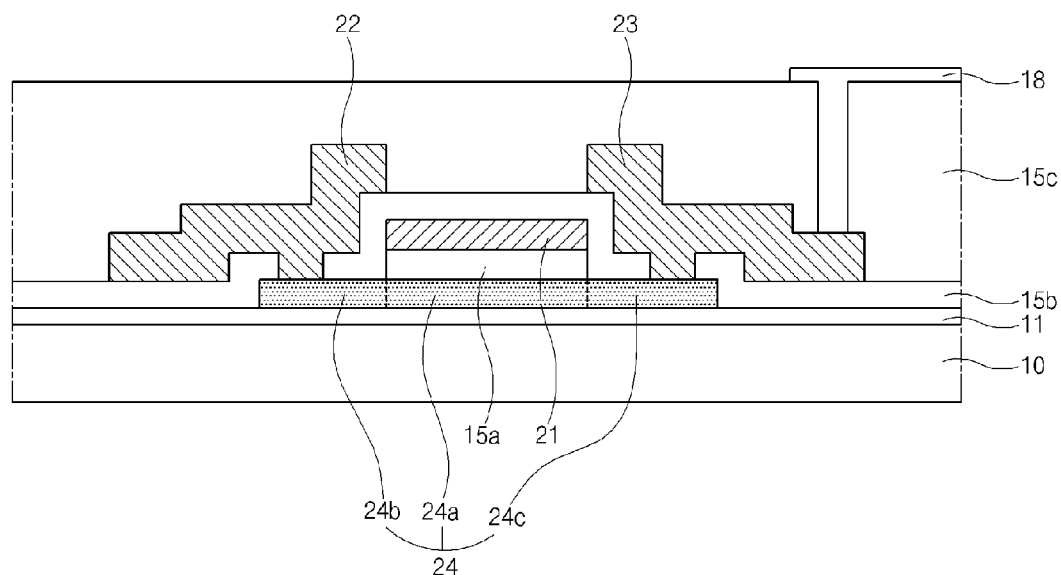
FIG. 1 is a cross-sectional view illustrating the coplanar type TFT according to the prior art.

The oxide layer 126 is formed by oxidizing a material that is used to form the second source and drain patterns 122b and 123b and is located at a region corresponding to the channel region 124a. Accordingly, the oxide layer 126 covers the channel region 124a, and the source and drain electrodes 122 and 123 covers the source and drain regions 124b and 124c, respectively. Accordingly, the second insulating layer (15b of FIG. 1) of the prior art is eliminated, thus a number of mask processes can be reduced, and thus production cost can be reduced and productivity can be improved.

The oxide layer 126 contacts the second source and drain patterns 122b and 123b at both sides.

The oxide layer 126 may extend such that it covers a part of the source and drain electrodes 124b and 124c.

FIGS. 3A to 3H are cross-sectional views illustrating a method of the array substrate for the LCD according to the embodiment of the present invention.

Figure 3A:
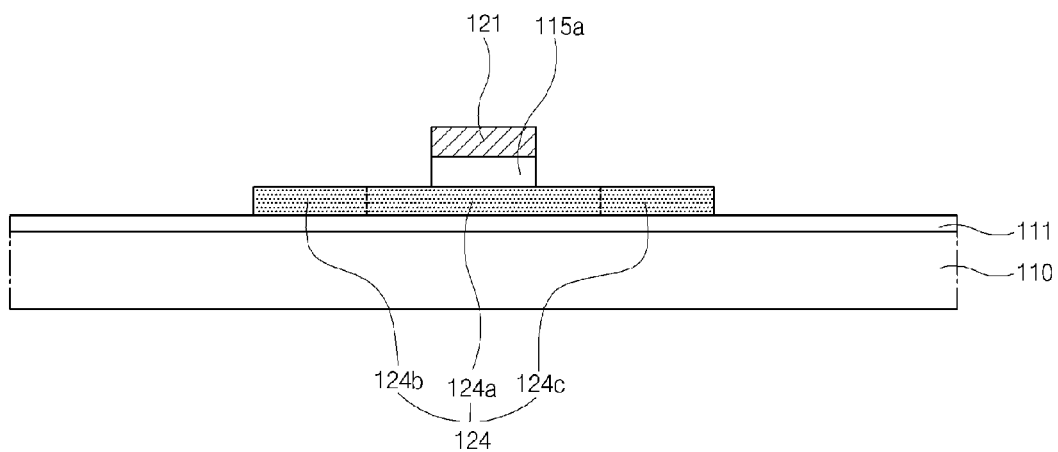
FIGS. 3A to 3H are cross-sectional views illustrating a method of the array substrate for the LCD according to the embodiment of the present invention.

Referring to FIG. 3A, the ZnO based semiconductor material is deposited on the buffer layer 111 to form the active layer 124, and then the first insulating layer 115a and the second electrode 121 are sequentially formed on the active layer 124.

In more detail, the ZnO based semiconductor material is patterned in a first mask process to form the active layer 124.

The ZnO bsed semiconductor material may be formed, for example, using a complex target of $Ga_2O_3$, $In_2O_3$ and ZnO in a sputtering method, and alternatively, in a CVD (chemical vapor deposition) method, or ALD (atomic layer deposition) method.

The first insulating layer 115a may be formed of an inorganic insulating material, for example, SiNx or $SiO_2$, or a high dielectric constant oxide material, for example, hafnium oxide or aluminum oxide.

The first insulating material 115a may be formed in a CVD method, or PECVD (plasma enhanced CVD) method.

The gate electrode 121 may be formed of a conductive material having a low resistance and being opaque, for example, Al, Al alloy, W, Cu, Ni, Cr, Mo, Ti, Pt or Ta, or a transparent conductive material, for example, ITO or IZO. Alternatively, the gate electrode 121 may have a multiple-layered structure using at least two of the above materials.

The first gate insulating material and the gate electrode material are deposited entirely on the substrate 110 and patterned in a second mask process to form the first insulating layer 115a and the gate electrode 121.

The first insulating layer 115a and the gate electrode 121 may be formed using a dry etching process.

Figure 3B:
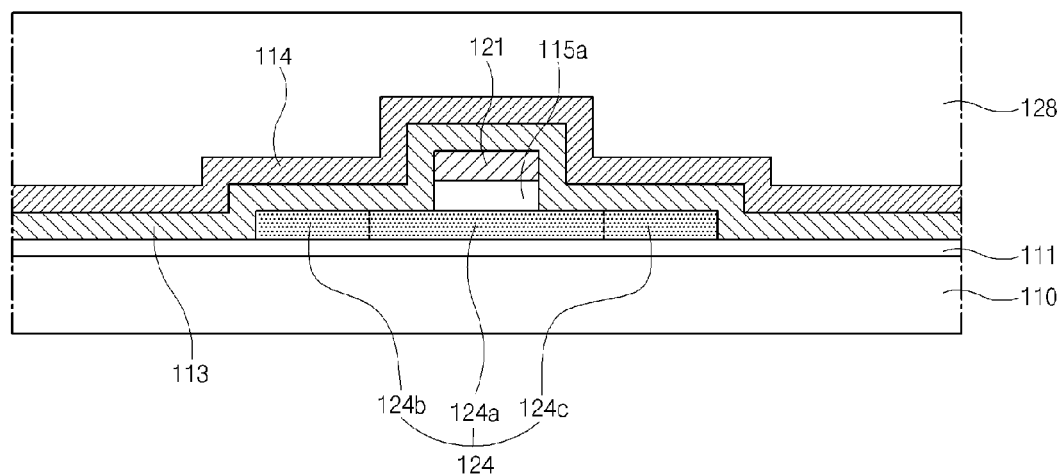

Then, referring to FIG. 3B, a first metal layer 113 and a second metal layer 114 are sequentially formed on the substrate 110 having the gate electrode 121.

The first metal layer 113 may be formed of a metal having a low contact resistance for a conductor to meet a high mobility and a constant current test condition, for example, Al, Al alloy, Cu, Ni, Cr, Ti, Pt, Ta, Ti alloy, Mo or Mo alloy. For example, the first metal layer 113 may have a contact resistance less than the second metal layer 114.

A contact resistance, with the active layer 124, off the second metal layer 114 may not be considered by using the first metal layer 113. Accordingly, the second metal layer 114 may be formed of a metal having a specific resistance less than the first metal layer 113, for example, Cu, Au or Mo.

The first metal layer 113 may have a thickness of about 200 angstroms or less to meet a high mobility and a constant current test condition, and preferably has about 100 angstroms to about 200 angstroms.

A photoresist layer 128 is formed entirely on the substrate 110 having the first and second metal layers 113 and 114.

Figure 3C:
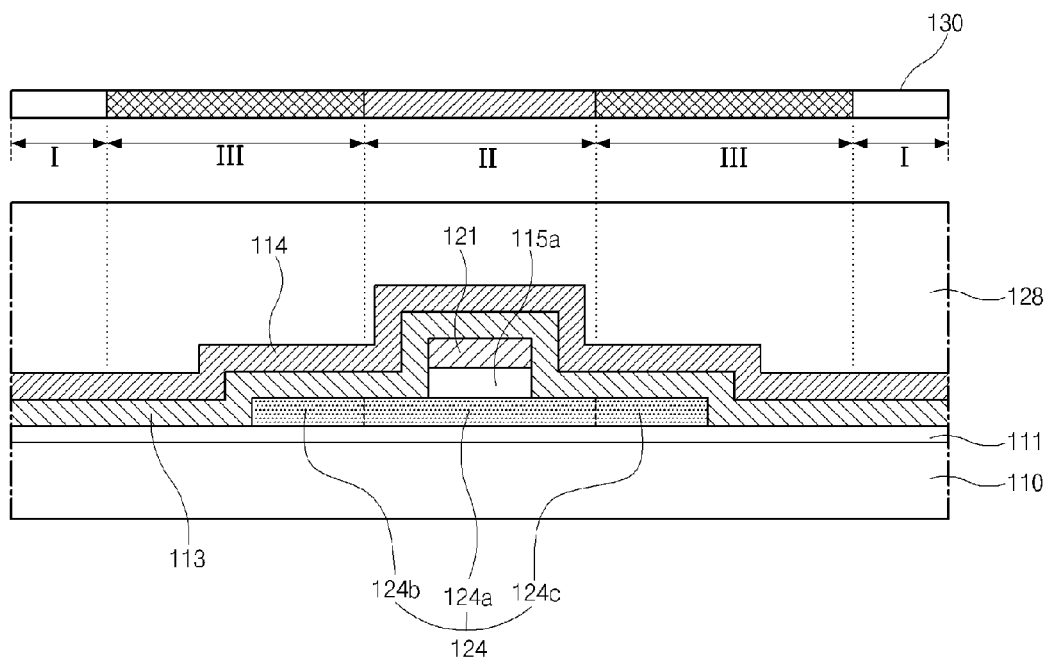

Then, referring to FIG. 3C, in a third mask process, exposing the photoresist layer 128 selectively to light is conducted.

The light exposure may be conducted using a single photo mask or a halftone mask 130. In the embodiment, the halftone mask 130 is preferably used to reduce a number of mask processes.

The halftone mask 130 includes a transmissive portion I transmitting, a semi-transmissive portion II, and a blocking portion III.

Figure 3D:
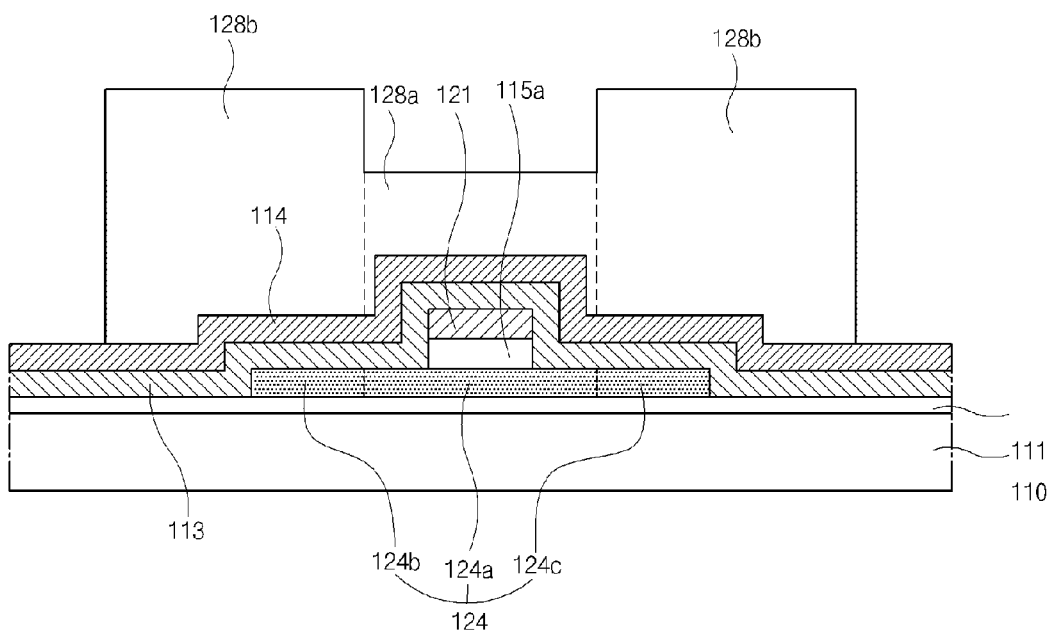

Referring to FIG. 3D, after the light exposure using the halftone mask 130, a developing process of the photoresist layer 128 is conducted. Accordingly, a portion of the photoresist layer 128 corresponding to the tranmissive portion I is removed, a portion of the photoresist layer 128 corresponding to the semi-transmissive portion II is partially removed to become a first photoresist pattern 128a, and a portion of the photoresist layer 128 corresponding to the blocking portion III remains and becomes a second photoresist pattern 128b that is thicker than the first photoresist pattern 128a. The second photoresist pattern 128b is located at each of both sides of the first photoresist pattern 128a. In other words, the second photo resist patterns 128b are located corresponding to the source and drain regions 124b and 124c.

The first and second metal layers 113 and 114 are patterned using the first and second photoresist patterns 128a and 128b.

Figure 3E:
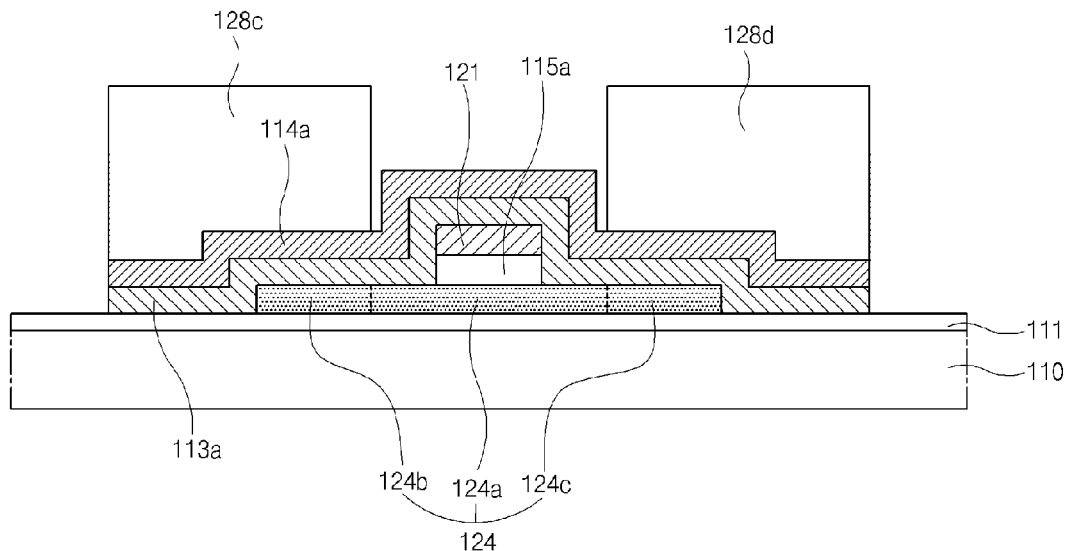

In other words, referring to FIG. 3E, the first and second metal layers 113 and 114 are etched using the first and second photoresist patterns 128a and 128b to form the first and second metal patterns 113a and 114a. This etching process may be a wet etching process. The first and second metal patterns 113a and 114a are formed continuously over the active layer 124.

Then, an ashing process is conducted to remove the first photoresist pattern 128a and partially remove the second photoresist patterns 128b by a thickness of the first photoresist pattern 128a. The ashed second photoresist patterns 128b corresponding to the source and drain regions 124b and 124c become third and fourth photoresist patterns 128c and 128d.

Figure 3F:
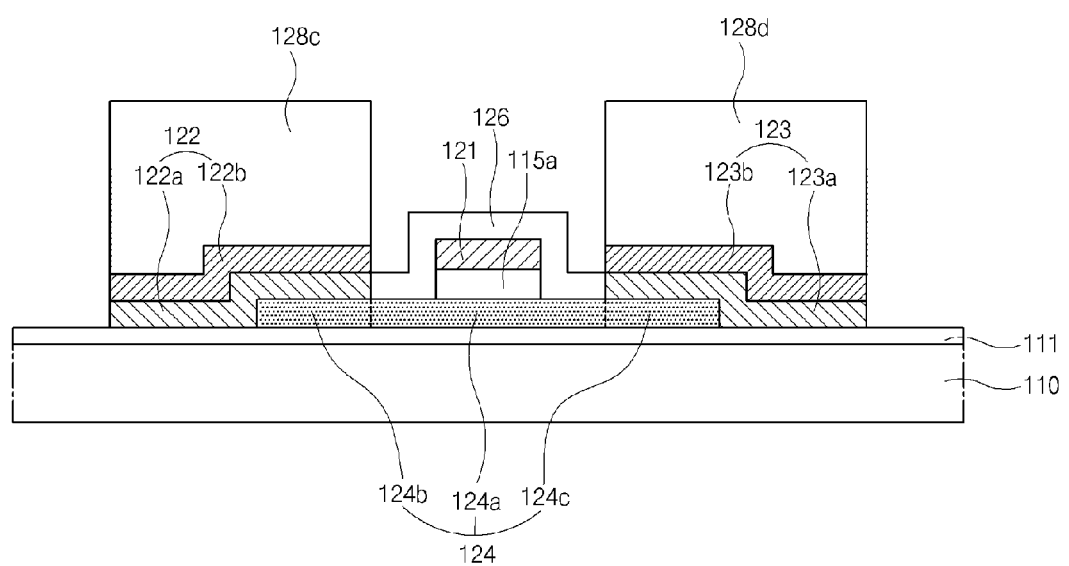

Then, referring to FIG. 3F, the second metal pattern 114a is etched using the third and fourth photoresist patterns 128c and 128d. This etching process may be a dry etching process. Accordingly, the first source and drain patterns 122a and 123a spaced apart from each other are formed.

Then, a portion of the first metal pattern 113a exposed between the third and fourth photoresist patterns 128c and 128d is oxidized. For example, an oxygen plasma treatment or a thermal treatment under oxygen atmosphere for a predetermined time is conducted to oxidize the exposed portion of the first metal pattern 113a. Accordingly, the exposed portion of the first metal pattern 113a becomes the oxide layer 126.

The oxide layer 126 may be made of at least one of AlxOx, AlxOx alloy, CuxOx, NixOx, CrxOx, TixOx, PtxOx, TaxOx, TixOx alloy, MoxOx and MoxOx alloy.

The oxide layer 126 is a nonconductor and functions as an insulator. Accordingly, the first metal pattern 113a is modified into the second source and drain patterns 122b and 123b and the oxide layer 126 between the second source and drain patterns 122b and 123b.

After forming the oxide layer 126, the third and fourth photoresist patterns 128c and 128d are stripped using an ashing process.

Accordingly, the source electrode 122 including the first and second source patterns 122a and 122b, and the drain electrode 123 including the first and second drain patterns 123a and 123b are formed.

Figure 3G:
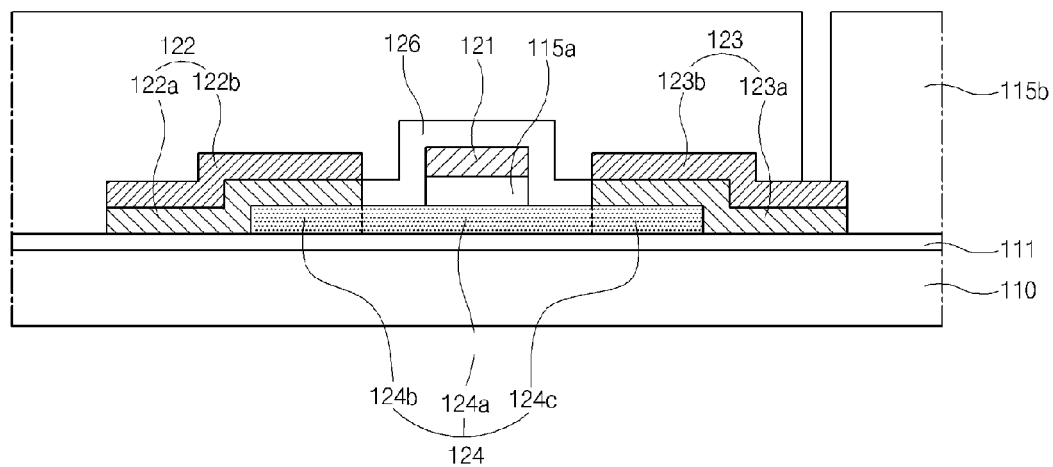

Then, referring to FIG. 3G, the second insulating layer 115b is formed entirely on the substrate 110 having the source and drain electrodes 122 and 123. Then, the second insulating layer 115b is patterned in a fourth mask process to form a contact hole exposing the drain electrode 123.

Figure 3H:
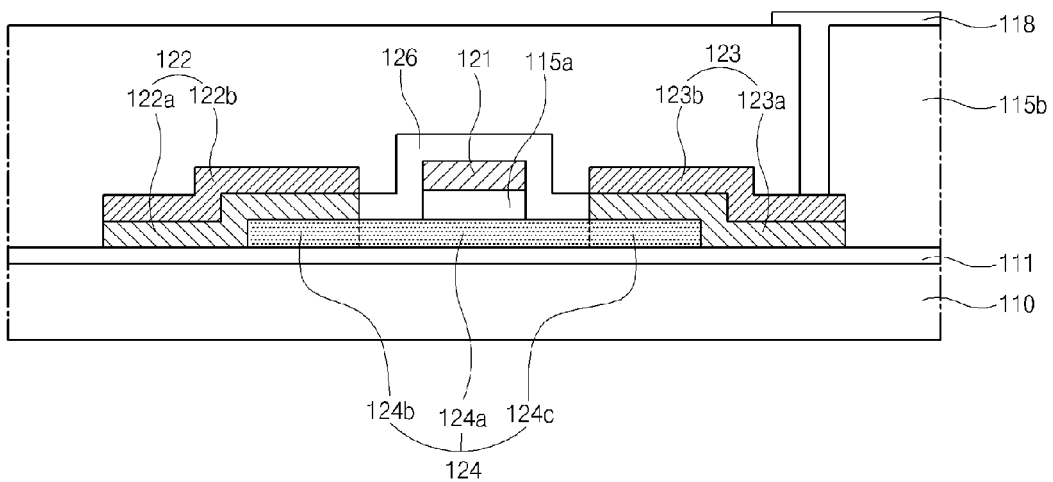

Then, referring to FIG. 3H, a third metal layer is formed entirely on the second insulating layer 115b and is patterned in a fifth mask process to form a pixel electrode 118 contacting the drain electrode 123 through the contact hole of the second insulating layer 115b.

Through the above-described processes, the array substrate for the LCD according to the embodiment is manufactured.

In the array substrate, the active layer 124 is made of the ZnO based material, and thus the TFT has a high mobility and meets a constant current test condition. The LCD is applicable to a large-sized display.

Further, the first metal pattern 113a to form the source and drain electrodes 122 and 123 covers the active layer 124, and the portion of the first metal pattern 113a corresponding to the channel region 124a is oxidized and covers the channel region 124a. Accordingly, the prior art second insulating layer (15b of FIG. 1) is eliminated, and thus a number of mask process can be reduced.

Thus, production cost can be reduced, and productivity can be improved.

It will be apparent to those skilled in the art that various modifications and variations can be made in a display device of the present disclosure without departing from the sprit or scope of the invention. Thus, it is intended that the present invention covers the modifications and variations of this invention provided they come within the scope of the appended claims and their equivalents.

What is claimed is:

1. A method of manufacturing an array substrate for a liquid crystal display device, comprising:
    forming a semiconductor layer on a substrate, the semiconductor layer including source and drain regions and a channel region between the source and drain regions;
    forming a first insulating layer on a portion of the channel region of the semiconductor layer;
    forming a gate electrode directly on the first insulating layer and corresponding to the portion of the channel region;
    forming a first metal layer directly on and in contact with the gate electrode and the semiconductor layer, and a second metal layer directly on and in contact with the first metal layer;
    patterning the first metal layer and the second metal layer to form a first metal pattern and a second metal pattern, respectively;
    etching the second metal pattern to form a first source pattern and a first drain pattern and expose a portion of the first metal pattern between the first source pattern and the first drain pattern; and
    oxidizing the exposed portion of the first metal pattern to form an oxide layer, a second source pattern and a second drain pattern,
    wherein the oxide layer corresponds to the channel region to fully contact and cover the gate electrode and the first insulating layer,
    wherein the second source and drain patterns are in contact with the source and drain regions, respectively,
    wherein the second source pattern is directly below the first source pattern and is in contact with the substrate or a buffer layer disposed on the substrate, the second drain pattern is directly below the first drain pattern and is in contact with the substrate or the buffer layer disposed on the substrate, wherein the first source and drain patterns have substantially the same pattern as the second source and drain patterns, respectively, wherein the first and second source patterns form a source electrode, and the first and second drain patterns form a drain electrode.

2. The method of claim 1, wherein forming the first and second metal patterns includes:

forming first and second photoresist patterns on the second metal layer; and patterning the first and second metal layers using the first and second photoresist patterns to form the first and second metal patterns.

3. The method of claim 2, wherein the first and second photoresist patterns are formed using a halftone mask.

4. The method of claim 2, wherein forming the second source and drain patterns includes:

removing the first photoresist pattern and partially removing the second photoresist patterns through an ashing process, thereby forming third and fourth photoresist patterns; and etching the second metal pattern using the third and fourth photoresist patterns to expose the portion of the first metal pattern and form the second source and drain patterns.

5. The method of claim 1, wherein the second metal layer has a specific resistance less than the first metal layer, and has a contact resistance for a conductor greater than the first metal layer.

6. The method of claim 1, wherein the first metal layer is made of one of Al, Al alloy, Cu, Ni, Cr, Ti, Pt, Ta, Ti alloy, Mo and Mo alloy, and the second metal layer is made of one of Cu, Au and Mo.

7. The method of claim 1, wherein oxidizing the exposed portion of the first metal pattern to form an oxide layer is conducted using an oxygen plasma treatment or a thermal treatment under oxygen atmosphere for the exposed portion of the first metal pattern.

8. The method of claim 1, further comprising:

forming a second insulating layer on the source and drain electrodes;

forming a contact hole in the second insulating layer, the contact hole exposing the drain electrode; and forming a pixel electrode that is on the second insulating layer and contacts the drain electrode through the contact hole.

* * * * *